(12) United States Patent
Nemati et al.

(10) Patent No.: US 6,727,529 B2
(45) Date of Patent: Apr. 27, 2004

(54) SEMICONDUCTOR CAPACITIVELY-COUPLED NDR DEVICE AND RELATED APPLICATIONS IN HIGH-DENSITY HIGH-SPEED MEMORIES AND IN POWER SWITCHES

(75) Inventors: Farid Nemati, Stanford, CA (US); James D. Plummer, Portola Valley, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 10/103,241

(22) Filed: Mar. 20, 2002

(65) Prior Publication Data

US 2002/0096689 A1 Jul. 25, 2002

Related U.S. Application Data

(63) Continuation of application No. 09/666,825, filed on Sep. 21, 2000, now Pat. No. 6,448,586, which is a continuation of application No. 09/092,449, filed on Jun. 5, 1998, now Pat. No. 6,229,161.

(51) Int. Cl.[7] ............................................. H01L 29/74
(52) U.S. Cl. ....................... 257/133; 257/147; 257/155; 365/180
(58) Field of Search ................................ 257/133, 147, 257/155; 365/180

(56) References Cited

U.S. PATENT DOCUMENTS

| | | | |
|---|---|---|---|
| 3,918,033 A | 11/1975 | Case et al. | |
| 3,986,177 A | 10/1976 | Picquendar et al. | |
| 4,090,254 A | 5/1978 | Ho et al. | |
| 4,146,902 A | 3/1979 | Tanimoto et al. | |
| 4,590,589 A | 5/1986 | Gerzberg | |
| 4,612,448 A | 9/1986 | Strack | |
| 4,677,455 A | 6/1987 | Okajima | |
| 4,959,703 A | 9/1990 | Ogura et al. | |
| 5,321,285 A | 6/1994 | Lee et al. | |
| 5,324,966 A | 6/1994 | Muraoka et al. | |
| 5,390,145 A | 2/1995 | Nakasha et al. | |
| 5,396,454 A | 3/1995 | Nowak | |
| 5,412,598 A | 5/1995 | Shulman | |
| 5,464,994 A | 11/1995 | Shinohe et al. | |
| 5,471,419 A | 11/1995 | Sankaranarayanan et al. | |
| 5,525,820 A | 6/1996 | Furuyama | |
| 5,543,652 A | 8/1996 | Ikeda et al. | |
| 5,587,944 A | 12/1996 | Shen et al. | |
| 5,689,458 A | 11/1997 | Kuriyama | |
| 5,874,751 A | 2/1999 | Iwamuro et al. | |
| 5,910,738 A | 6/1999 | Shinohe et al. | |
| 5,914,503 A | 6/1999 | Iwamuro et al. | |
| 5,936,267 A | 8/1999 | Iwamuro | |
| 5,939,736 A | 8/1999 | Takahashi | |
| 5,981,984 A | 11/1999 | Iwaana et al. | |
| 6,229,161 B1 | 5/2001 | Nemati et al. | |
| 6,448,586 B1 * | 9/2002 | Nemati et al. | 257/133 |

OTHER PUBLICATIONS

Jun. 1998, F.Nemati and J.D. Plummer, *A Novel High Density, Low Voltage SRAM Cell with a Vertical NDR Device*, Center for Integrated Systems, Stanford University, Stanford, CA 94305.

F.Nemati and J.D. Plummer, *A Novel Vertical Storage SRAM Cell*, Student Paper written for Center for Integrated Systems, Stanford University, Stanford, CA 94305.

F. Nemati and J.D. Plummer, *A Novel Thyristor–based SRAM Cell (T–RAM) for High–Speed, Low–Voltage, Giga–scale Memories*, Center for Integrated Systems, Stanford University, Stanford, CA, 1999.

1987, Baliga, B.Jayant, *Modern Power Devices*, pp. 349–350.

Feb. 1980, Plummer, James D. and Scharf, Brad W., *Insulated–Gate Planar Thyristors: I–Structure and Basic Operation*, pp. 380–386.

1981, S. M. Sze, *Physics of Semiconductor Devices Second Edition*, John Wiley & Sons, pp. 198–209, 1981.

* cited by examiner

*Primary Examiner*—Sara Crane

(57) ABSTRACT

A novel capacitively coupled NDR device can be used to implement a variety of semiconductor circuits, including high-density SRAM cells and power thyristor structures. In one example embodiment, the NDR device is used as a thin vertical PNPN structure with capacitively-coupled gate-assisted turn-off and turn-on mechanisms. An SRAM based on this new device is comparable in cell area, standby current, architecture, speed, and fabrication process to a DRAM of the same capacity. In one embodiment, an NDR-based SRAM cell consists of only two elements, has an 8 $F^2$ footprint, can operate at high speeds and low voltages, has a good noise-margin, and is compatible in fabrication process with main-stream CMOS. This cell significantly reduces standby power consumption compared to other types of NDR-based SRAMs.

15 Claims, 9 Drawing Sheets

SEMICONDUCTOR CAPACITIVELY-COUPLED NDR DEVICE AND RELATED APPLICATIONS IN HIGH-DENSITY HIGH-SPEED MEMORIES AND IN POWER SWITCHES

RELATED PATENT DOCUMENTS

This is a continuation of U.S. patent application Ser. No. 09/666,825, filed on Sep. 21, 2000 now U.S. Pat. No. 6,448,586, which is a continuation of Ser. No. 09/092,449, filed on Jun. 5, 1998 now U.S. Pat. No. 6,229,161, to which priority is claimed under 35 U.S.C. §120.

The Government has certain rights in this invention which was made with Government support under contract MDA972-95-1-0017 awarded by the Defense Research Projects Agency.

FIELD OF THE INVENTION

The present invention is directed to the construction and manufacture of semiconductor capacitively coupled negative differential resistance ("NDR") devices and to circuit applications such as SRAMs and power thyristors that include such devices.

BACKGROUND

The electronics industry continues to strive for high-powered, high-functioning circuits. Significant achievements in this regard have been realized through the fabrication of very large-scale integration of circuits on small areas of silicon wafers. Integrated circuits of this type are manufactured through a series of steps carried out in a particular order. The main objectives in manufacturing many such devices include obtaining a device that occupies as small an area as possible and consuming low levels of power using low supply levels, while performing at speeds comparable to speeds realized by much larger devices. To obtain these objectives, steps in the manufacturing process are closely controlled to ensure that rigid requirements, for example, of exacting tolerances, quality materials, and clean environment, are realized.

An important part in the circuit construction, and in the manufacture, of semiconductor devices concerns semiconductor memories; the circuitry used to store digital information. The construction and formation of such memory circuitry typically involves forming at least one storage element and circuitry designed to access the stored information. In applications where circuit space, power consumption, and circuit speed are primary design goals, the construction and layout of memory devices can be very important.

Conventional random access memory devices, such as SRAM and DRAM, often compromise these primary design goals. SRAMs, for example, include circuit structures that compromise at least one of these primary design goals. A conventional SRAM based on a four-transistor ("4T") cell or a six-transistor ("6T") cell has four cross-coupled transistors or two transistors and two resistors, plus two cell-access transistors. Such cells are compatible with mainstream CMOS technology, consume relatively low levels of standby power, operate at low voltage levels, and perform at relatively high speeds. However, the 4T and 6T cells are conventionally implemented using a large cell area; and this significantly limits the maximum density of such SRAMs.

Other SRAM cell designs are based on NDR (Negative Differential Resistance) devices. They usually consist of at least two active elements, including an NDR device. The NDR device is important to the overall performance of this type of SRAM cell. A variety of NDR devices have been introduced ranging from a simple bipolar transistor to complicated quantum-effect devices. The biggest advantage of the NDR-based cell is the potential of having a cell area smaller than 4T and 6T cells because of the smaller number of active devices and interconnections. Conventional NDR-based SRAM cells, however, have many problems that have prohibited their use in commercial SRAM products. Some of these problems include: high standby power consumption due to the large current needed in one or both of the stable states of the cell; excessively high or excessively low voltage levels needed for the cell operation; stable states that are too sensitive to manufacturing variations and provide poor noise-margins; limitations in access speed due to slow switching from one state to the other; and manufacturability and yield issues due to complicated fabrication processing.

NDR devices such as thyristors are also widely used in power control applications because the current densities carried by such devices can be very high in their on state. However, a significant difficulty with these devices in such applications is that once switched to their on-state, they remain in this state until the current is reduced below the device holding current. Also, in general, when the main current is interrupted, the time required for the thyristor to return to the blocking (OFF) state is largely determined by the carrier lifetime and can be quite long. This inability to switch the device off without interrupting the current and the associated slow switching speed are significant problems in many applications and have resulted in many attempts to modify the device structures so that it can be actively and rapidly switched off.

SUMMARY

One aspect of the present invention is directed to a capacitively-coupled NDR device that largely alleviates the above-mentioned problems.

According to one example embodiment of the present invention, a semiconductor device includes an NDR-type thyristor device with at least two oppositely polarized contiguous regions and a control port that is located adjacent to, capacitively coupled to, and facing at least one of the thyristor-device regions. The control port is for providing preponderant control for switching the thyristor device from a current-passing mode to a current-blocking mode in response to the control port coupling at least one edge of a first voltage pulse to said at least one of the regions, and from a current-blocking mode to a current-passing mode in response to the control port coupling at least one edge of a second voltage pulse to said at least one of the regions, each of the first and second voltage pulses having a common polarity.

According to another example embodiment of the present invention, a semiconductor device includes an NDR-type thyristor device with at least two opposite polarized contiguous regions of the thyristor device and a control port that is located adjacent to, capacitively coupled to, and facing at least one of the thyristor-device regions. The control port is for providing at least preponderant control for switching of the thyristor device between a current-passing mode and a current-blocking mode in response to the control port coupling at least part of a voltage pulse to said at least one of the regions, with the switching being independent of any insulated-gate field-effect transistor inversion channel formation against said at least one of the regions.

According to another embodiment of the present invention, a semiconductor device is includes an array of memory cells, and an access circuit configured and arranged to provide reading and writing access to one or more selected cells in the array. Each cell has a storage node, a capacitively-switched NDR device for enhancing writing to the storage node, and a data circuit configured and arranged to couple data between the storage node and the access circuit.

According to yet another embodiment of the present invention, a semiconductor device includes a power switch structure. The power switch structure includes a plurality of combination NDR-device and control-port circuits. Each NDR device is constructed consistent with one of the above-mentioned approaches.

The above summary of the present invention is not intended to characterize each disclosed embodiment of the present invention. Among various other aspects contemplated as being within the scope of the claims, the present invention is also directed to methods of manufacturing the above structures and their respective circuit layouts.

BRIEF DESCRIPTION OF THE DRAWINGS

The invention may be more completely understood in consideration of the detailed description of various embodiments of the invention in connection with the accompanying drawings, in which.

Figure 1:
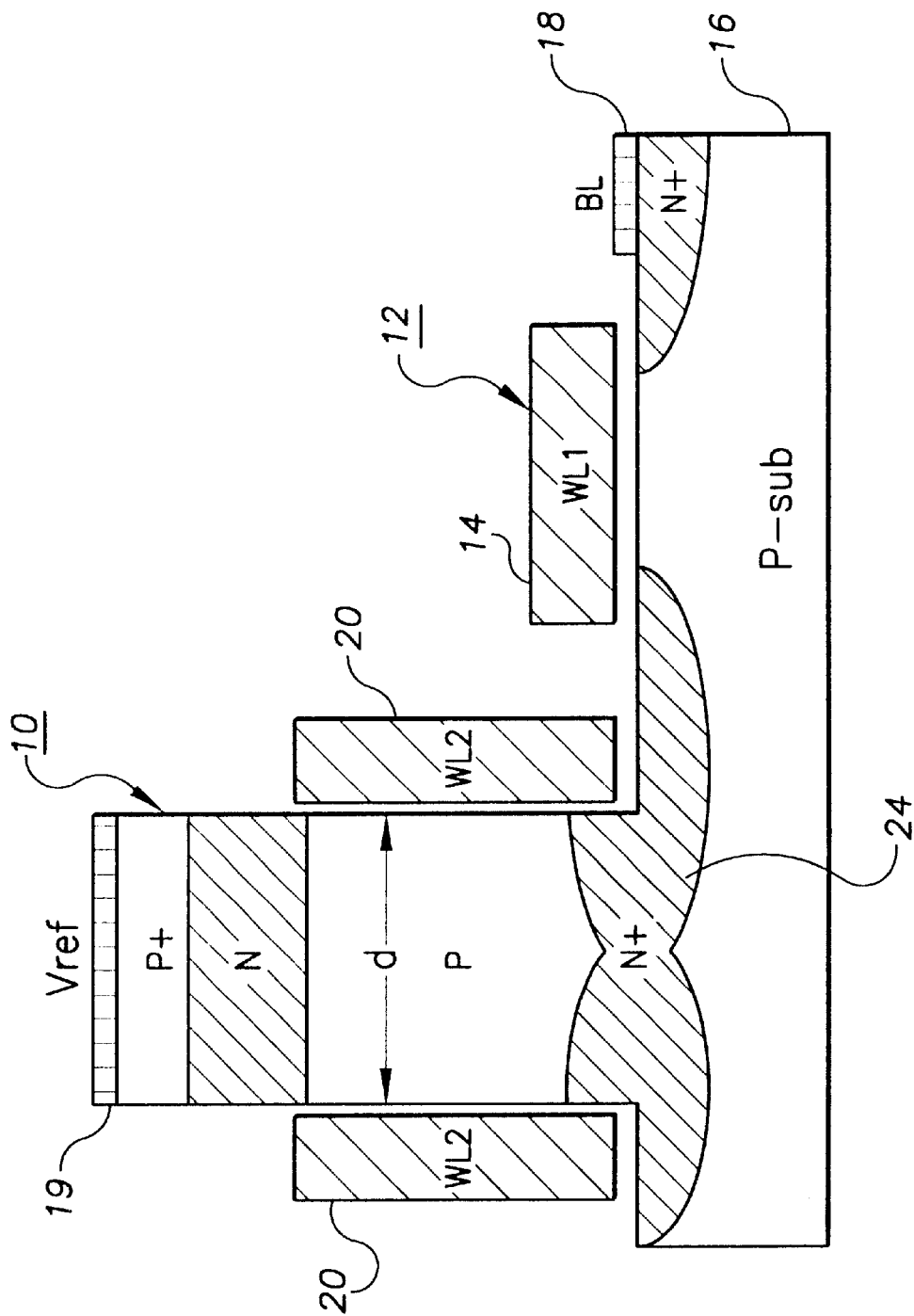
FIG. 1 illustrates a structural diagram, an example capacitively coupled NDR device in an SRAM cell arrangement, consistent with the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is directed to capacitively coupled NDR devices, such as multiple PN-type structures, and circuit applications thereof. The present invention has been found to be particularly advantageous for designs in need of NDR devices having improved on/off switching speed, and a low holding current in the on state. Unlike many NDR devices such as conventional thyristor structures that slowly turn-off due to the saturation of their junctions in the on state, and/or which may not turn off at all until the current is reduced below the holding current, one aspect of the present invention is directed to such a device that quickly switches between a current-passing mode and a current-blocking mode in response to a capacitively-coupled activation signal being present adjacent to at least one of the regions of the capacitively coupled NDR device. In addition, such a change can occur using a relatively low voltage, and the device can be implemented in a relatively small area.

A particular example embodiment of the present invention is directed to an NDR device that uses a capacitively-coupled gate adjacent to the NDR device. The location and construction of the NDR device and the gate are such that a voltage transition presented at the gate causes the NDR structure to improve the speed of the current switching.

Figure 2:
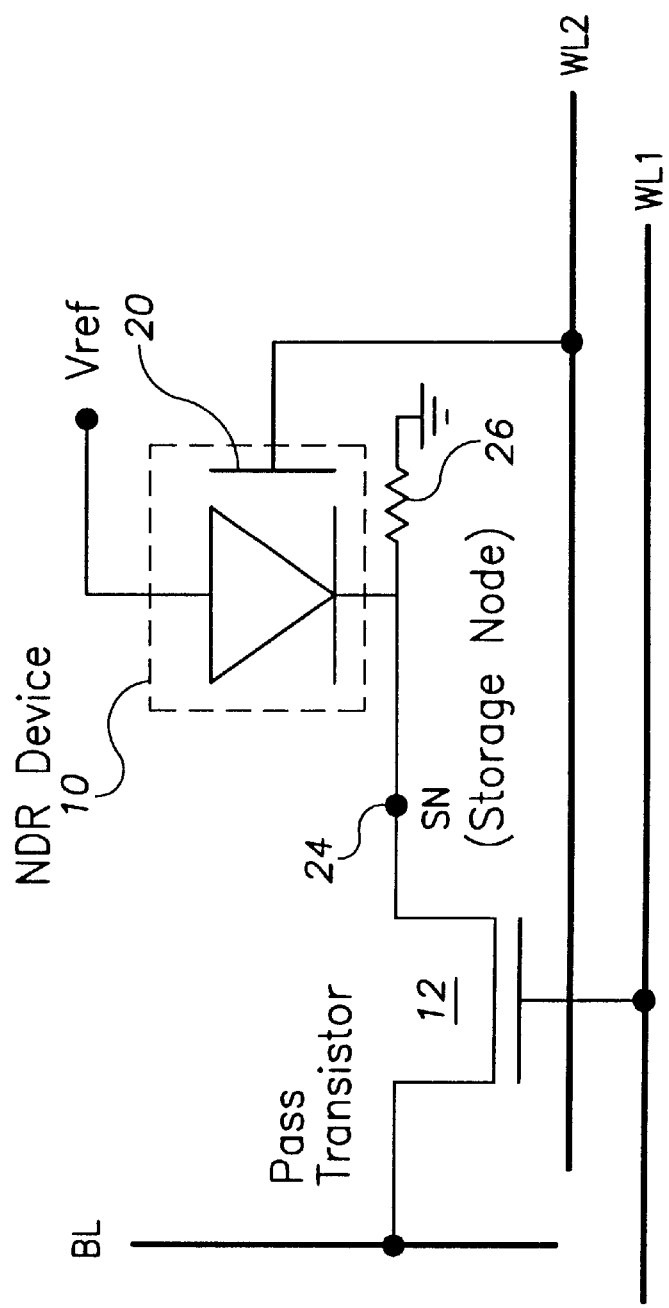
FIG. 2 illustrates a circuit diagram of the example arrangement of FIG. 1, consistent with the present invention.

Turning now to the drawings, FIGS. 1 and 2 respectively illustrate a structural diagram and a corresponding circuit diagram of an example SRAM cell arrangement that uses a capacitively coupled NDR device, according to the present invention. The example arrangement shown in FIG. 1 can be referred to as a thyristor based SRAM cell or T-RAM cell. The cell consists of two elements: a PNPN-type NDR device 10 and an NMOS-type access (or pass) transistor 12. The access (or pass) transistor 12 includes a gate 14 that forms part of a first word-line WL1 and N+ drain and source regions in a substrate 16, with one of the N+ drain and source regions connected to a bit-line (BL) 18. At the top of the vertical NDR device 10 is a metalization layer 19 that is used for connecting the top terminal of the device to a supply or reference voltage, Vref. The NDR device 10 is made vertically on top of a portion of the access transistor 12, over the source or drain that is not connected to the bit-line 18. The NDR device could also be fabricated adjacent to the access transistor.

The NDR device 10 has a middle P region adjacent to, and in a particular example embodiment surrounded by, a charge plate, or gate-like device, 20. The plate 20 forms part of a second word line (WL2) and is used to enhance switching between the cell's two stable states: the OFF state, where the device 10 is in a current-blocking mode; and the ON state, where the device 10 is in a current-passing mode. The voltage of the storage node 24 is at its high value for the ON state, and the holding current of the NDR device is provided by the subthreshold current of the access transistor 12.

FIG. 2 also shows a resistor 26 for an alternative embodiment, the resistor 26 being used to help maintain the holding current for the NDR device in its ON state. Although this approach increases the cell area, the approach is advantageous in that it may provide better controllability for the standby current in the cell.

In the illustrated example, the plate 20 overlaps the lower N+ region but not the upper N region. The PNPN device is sufficiently thin so that the gate has tight control on the potential of the P region of the PNPN and this potential can be modulated by the capacitive coupling via the plate 20. The lower N+ region is the internal node of the cell and corresponds to the storage node 24 of FIG. 2. The upper P+ region is connected to a reference voltage. WL2 is used for write operations and, more particularly, to speed up the device 10 turn-off when writing a logical zero to the cell and to enable the device 10 to turn-on at low voltages when writing a logical one to the cell. In standby mode, the word-lines and the bit-line are inactive or at their low voltage levels (which can be different for each line).

Figure 3B:
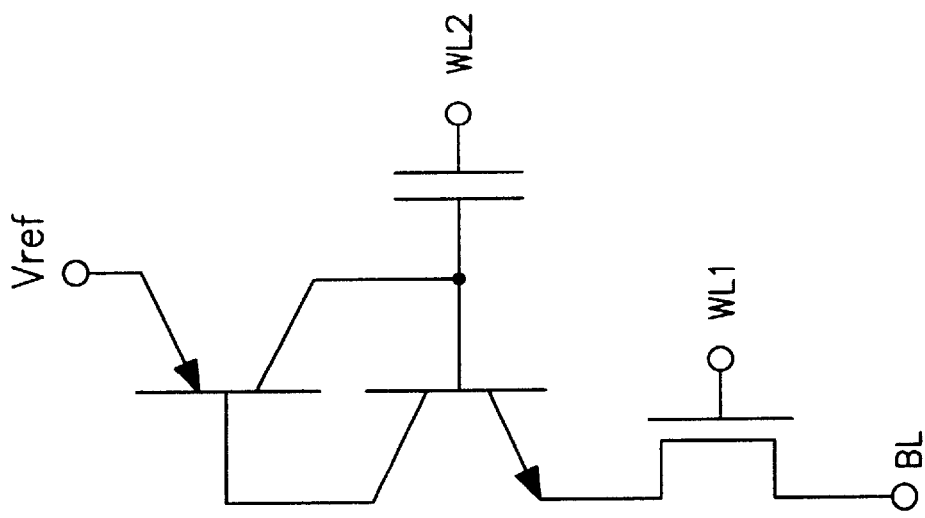
FIGS. 3a and 3b respectively illustrate DC and AC equivalent circuits of the example arrangement of FIG. 1.
Figure 3A:
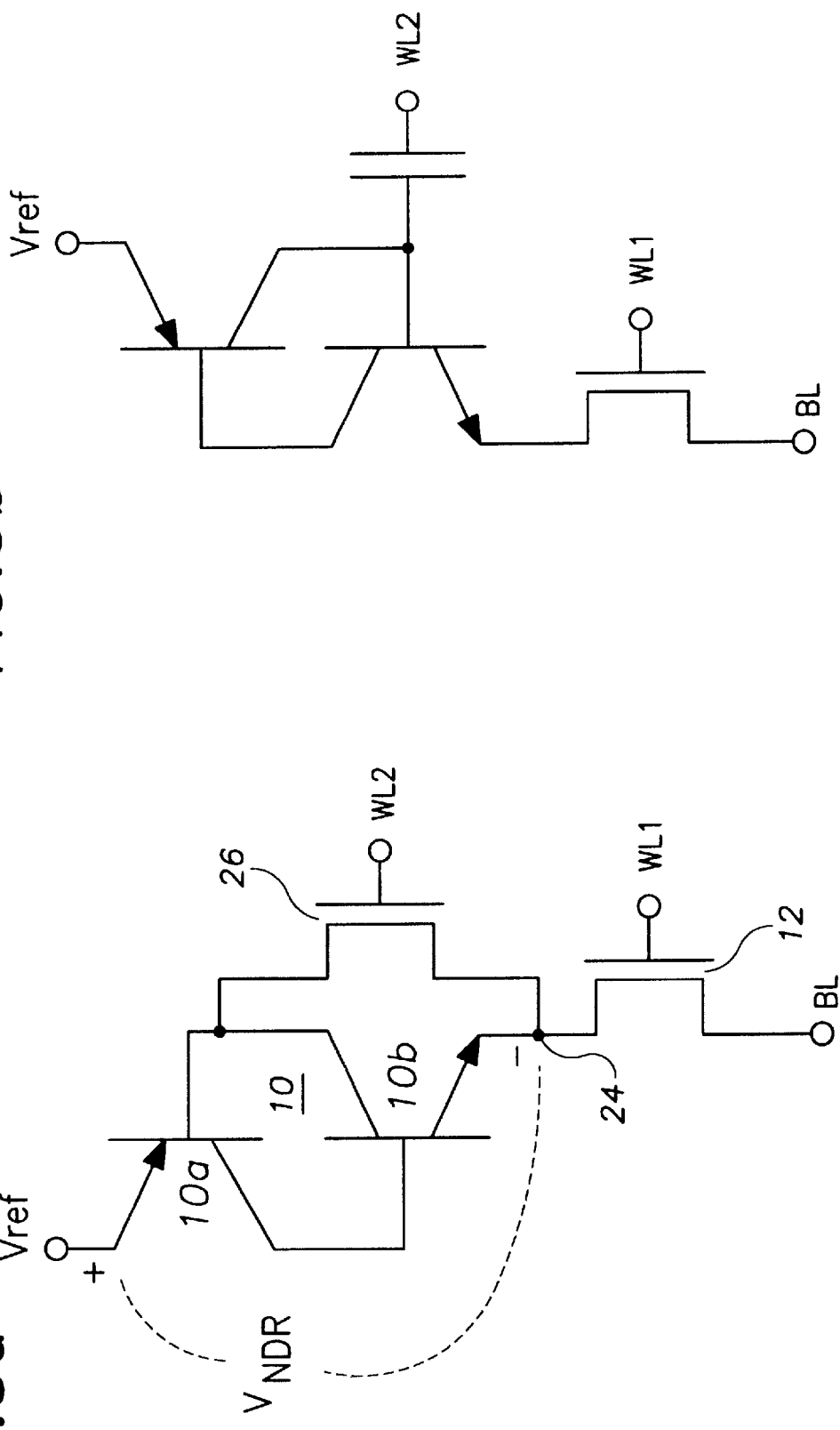

FIGS. 3a and 3b respectively illustrate DC and AC circuit models of the example arrangement of FIG. 1, shown using bipolar-junction transistors 10a and 10b. In each of the models, WL2 is shown capacitively coupled to the NDR device 10 at a P region to enhance, and thereby speed up, the switching of current between the terminals of the NDR device. At DC and low frequencies and for the example when the plate 20 overlaps the upper and lower N and N+ regions (FIG. 3a), the adjacent gate (20 of FIG. 1) is modeled as a vertical MOSFET 26 connecting the base of the PNP transistor 10a to the bit-line (BL) via the pass transistor. The function of the plate to enhance switching of the NDR device is independent of MOS inversion channel formation at high frequencies or when there is no gate overlap, the equivalent circuit model of the cell is shown in FIG. 3b, simplified to a capacitive coupling between WL2 and the P region of the PNPN.

Figure 4:
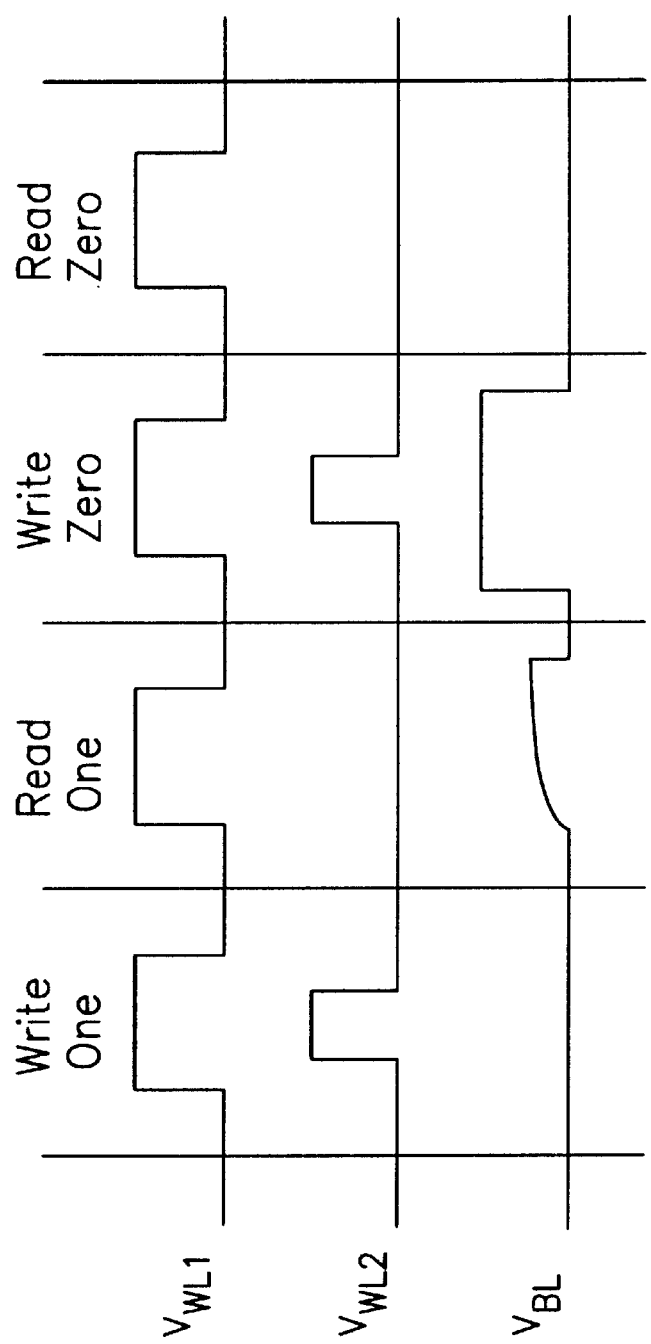
FIG. 4 is a timing diagram showing waveforms of various nodes of the circuit of FIG. 1, according to an example operation that is consistent with the present invention.

FIG. 4 is a timing diagram showing waveforms of various nodes of the circuit of FIG. 1, according to another aspect of the present invention. The diagram shows example read and write operations for this cell. For the read operation, WL1 is used to read the voltage of the storage node 24.

For the write One operation, the bit line stays low. After WL1 is raised to its high level, a pulse is applied to WL2. The rising edge of this pulse raises the potential of the P region by capacitive coupling and makes the NP and lower PN junctions forward biased which, in-turn, starts the well-known regenerative process in the PNPN and turns the NDR device on.

For the write Zero operation, BL is raised to its high level and WL1 becomes active. This charges the level at the storage node to a high voltage level and moves the NDR device out of the strong forward biased region. A pulse is then applied to WL2. The capacitive coupling between WL2 and the middle P region results in an outflow of the minority charges from the middle P region of the PNPN on the falling edge of the WL2 pulse and blocks the current pass. In this embodiment, this is done only when the PNPN device is "thin". The PNPN is switched to the blocking state after this operation. This turn-off operation does not depend on the normal turn-off mechanism in a multiple PN device (recombination of the minority charges inside the device) and therefore is fast and reliable.

Figure 5:
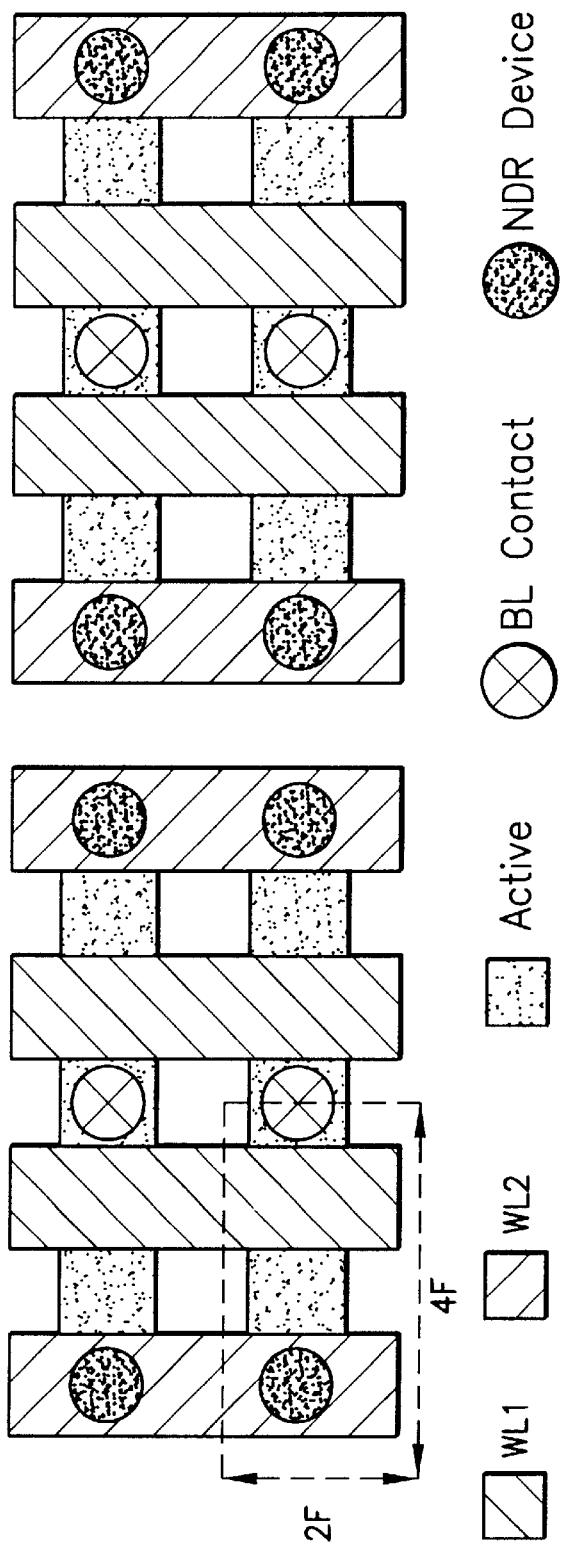
FIG. 5 is a layout arrangement of the example arrangement of FIG. 1 consistent with the present invention.

FIG. 5 is an example layout arrangement of the structure of FIG. 1, according to another aspect of the present invention. An important advantage of the structure of FIG. 1 is its considerably smaller cell area compared to conventional SRAM cells. This layout and structure can be implemented to consume a reasonable level of standby power, and to provide insensitivity to varying voltage levels, good noise margins and high speed. The structure of FIG. 5 is similar to conventional DRAMs in terms of architecture, speed, and the fabrication process. Further, in terms of the circuit real estate, the footprint of the cell shown in FIG. 5 is as small as the footprint of many conventional DRAM cells.

The fabrication of this cell structure can be based on CMOS technology with an additional epitaxial growth step to build the PNPN device, and this process can be similar to conventional stacked capacitor cells with the capacitance being replaced by the NDR device. According to one specific embodiment, the spacing between the bottom of each gate and the top of the NDR device is adjusted by a timed over-etch of the deposited poly. The gate adjacent to the PNPN device can be readily fabricated using well-known methods, including sidewall spacer or selective epitaxy methods. In a more specific embodiment, the gate(s) adjacent to the PNPN device is (are) fabricated using an anisotropic poly etch. The NDR device can be fabricated either before the planar device by etching silicon pillars and ion-implantation or after the planar device, for example, by selective epitaxial growth techniques.

Figure 6:
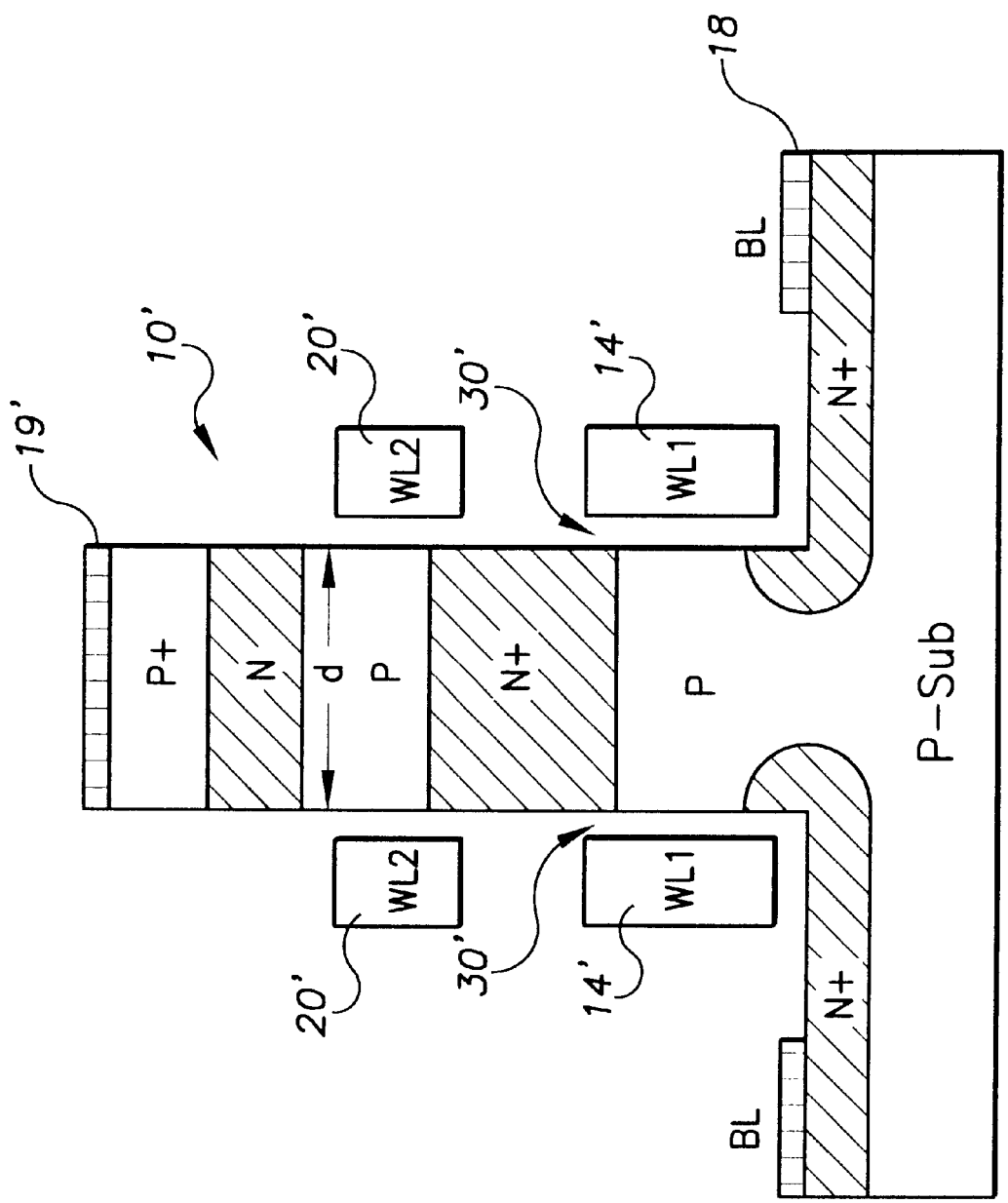
FIGS. 6 and 6a illustrate additional examples of capacitively coupled NDR devices, according to the present invention, which can be used as alternatives to the structure shown in FIG. 1.

FIG. 6 illustrates an alternative implementation to that which is shown in FIG. 1. The structures of FIGS. 1 and 6 differ in that the structure of FIG. 6 includes a vertically-arranged NMOSFET 30 instead of the NMOSFET 12 of FIG. 1, which is arranged in a planar manner relative to the P substrate. The NMOSFET 30 includes a gate 14' that at least partially surrounds the P region of the body of the NMOSFET 30. The read and write operations for this embodiment are as shown in FIG. 4. The embodiment of FIG. 6 can be implemented in a smaller area using a more involved fabrication process.

Figure 6A:
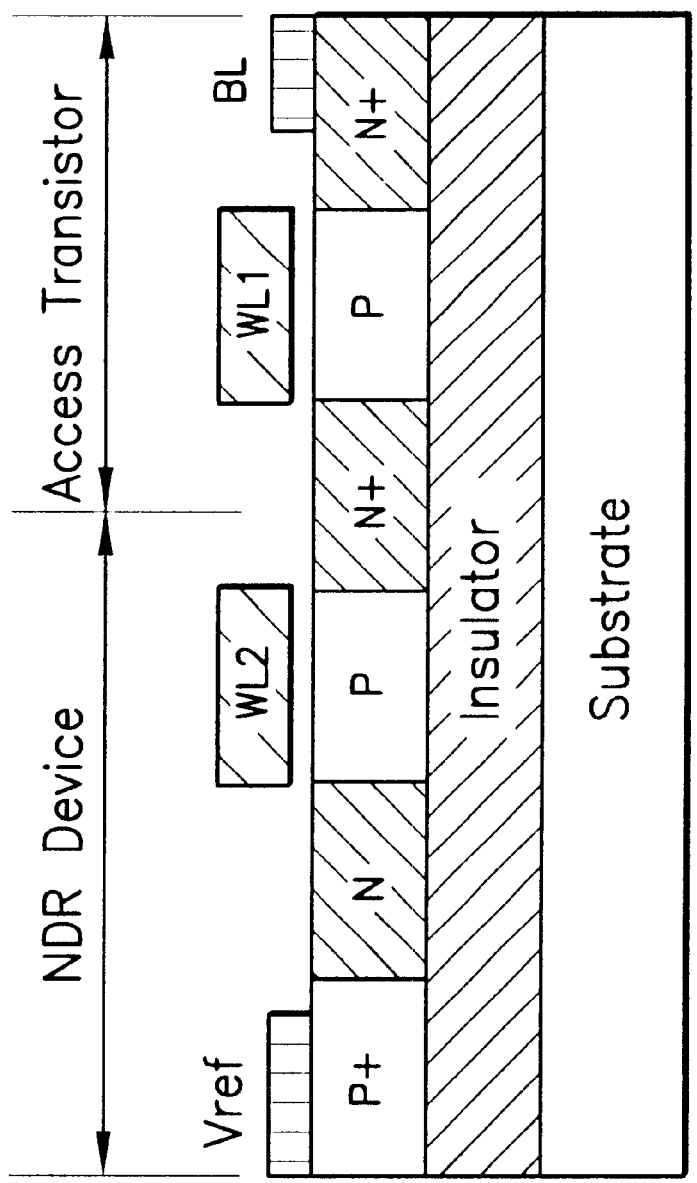

According to one embodiment, the gate for each of the structures of FIGS. 1 and 6 are adjacent to, and of sufficient size relative to, the facing region of the NDR device, so that the voltage transitions at the gate change the potential across the entire diameter ("d") of the subject region of the NDR device. Accordingly, this result is realized by selecting the thickness (as exemplified by "d") of the NDR device along with the size and proximity of the gate to facing region, as well as the doping concentration of the facing region of the NDR device. In one alternate embodiment, the gate only partially surrounds the facing region of the NDR device and the NDR device has a reduced thickness to offset the reduced capacitive coupling provided by the non-surrounding gate. FIG. 6a shows an example embodiment of a non-surrounding gate NDR device according to present invention in an SRAM cell arrangement similar to FIG. 1. Thin film SOI (Silicon on Insulator) technology is employed and the PNPN-type NDR device has a planar structure rather than the vertical structure in FIG. 1. The read and write operations for this embodiment are as shown in FIG. 4. In each of the above-mentioned structures, the NDR device can be implemented using any of a variety of shapes.

Figure 7:
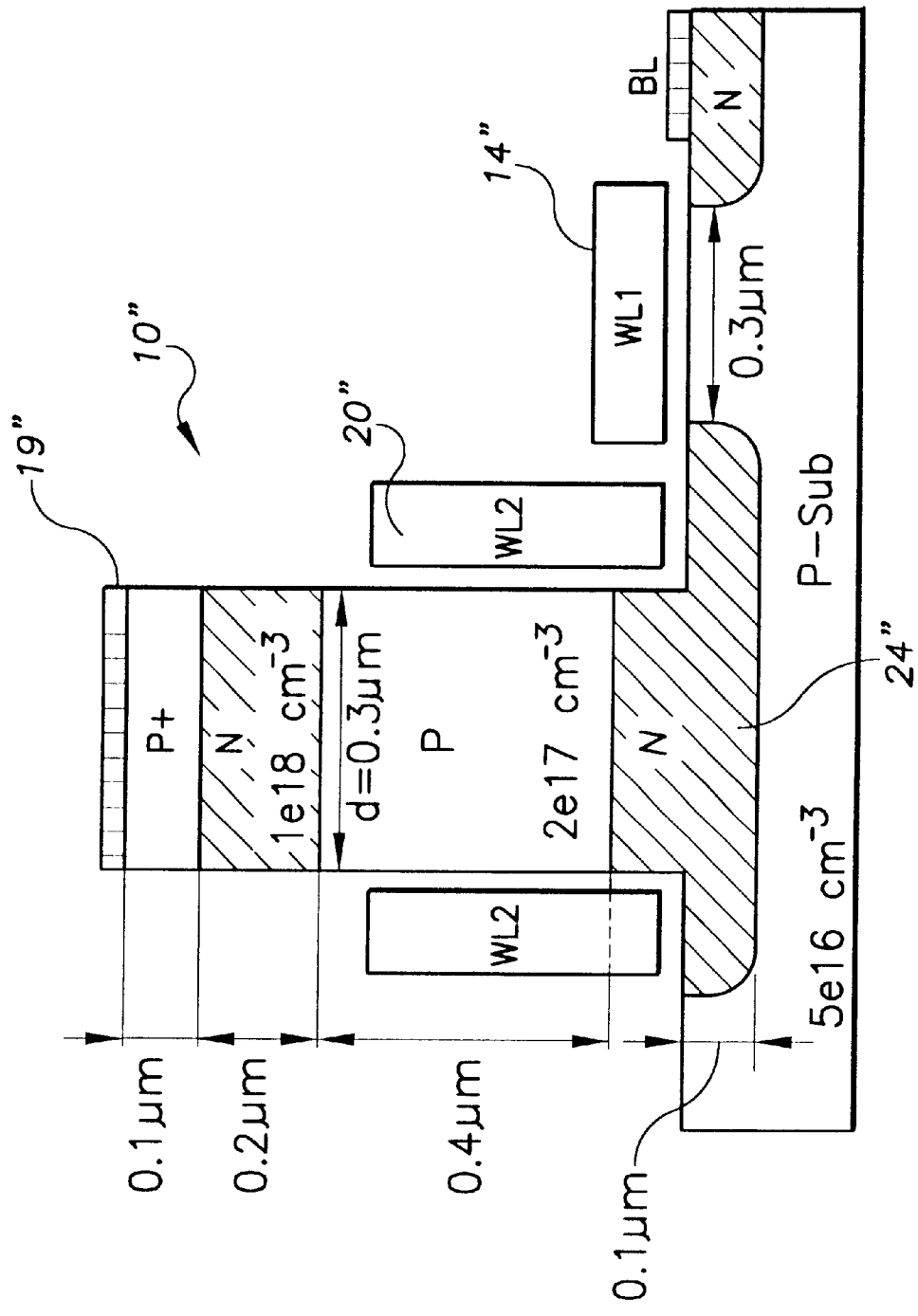
FIG. 7 illustrates another example capacitively coupled NDR device, according to the present invention.

A specific example embodiment uses a supply voltage of 1 volt, with each gate being N+ doped and with an oxide layer having a thickness of 200 Å. The dimensions of this example SRAM structure are shown in FIG. 7. The surrounding gate 20" (WL2) overlaps with the N region of the internal storage node 24, but not with the upper N region. The NDR device 10" is relatively thin, (0.3 um in this example embodiment) so that the gate has tight control on the potential of the P region of the NDR device 10" and this potential can be readily modulated by the capacitive coupling to the gate 20". In standby mode, BL and WL1 are kept at zero volts and WL2 is kept at −1V. If the PNPN device is off, the voltage level at the storage node is at zero volts. If the PNPN device is on, the voltage level at the storage node is about 0.4V to 0.5V. The threshold voltage of the access transistor is designed so that the holding current of the PNPN is provided by the subthreshold current of the access transistor. This holding current can be as low as pico-amps per $um^2$. The read and write operations are generally as described in connection with FIG. 4, with the upper voltage levels for WL1 at 3 volts, for BL at 2V, and for WL2 (or gate) being 2 volts.

According to another example embodiment and application of the capacitively coupled NDR device, a 1-Gigabit SRAM includes cells implemented consistent with the above two-element NDR-based structure (of either FIG. 1, FIG. 6 or FIG. 6a) and is implemented using 0.2 μm technology with standby current operating at less than 10 mA. Conventional logic circuitry (not shown) is used to control the timing and levels of the access signals (the word and bit lines).

Figure 8:
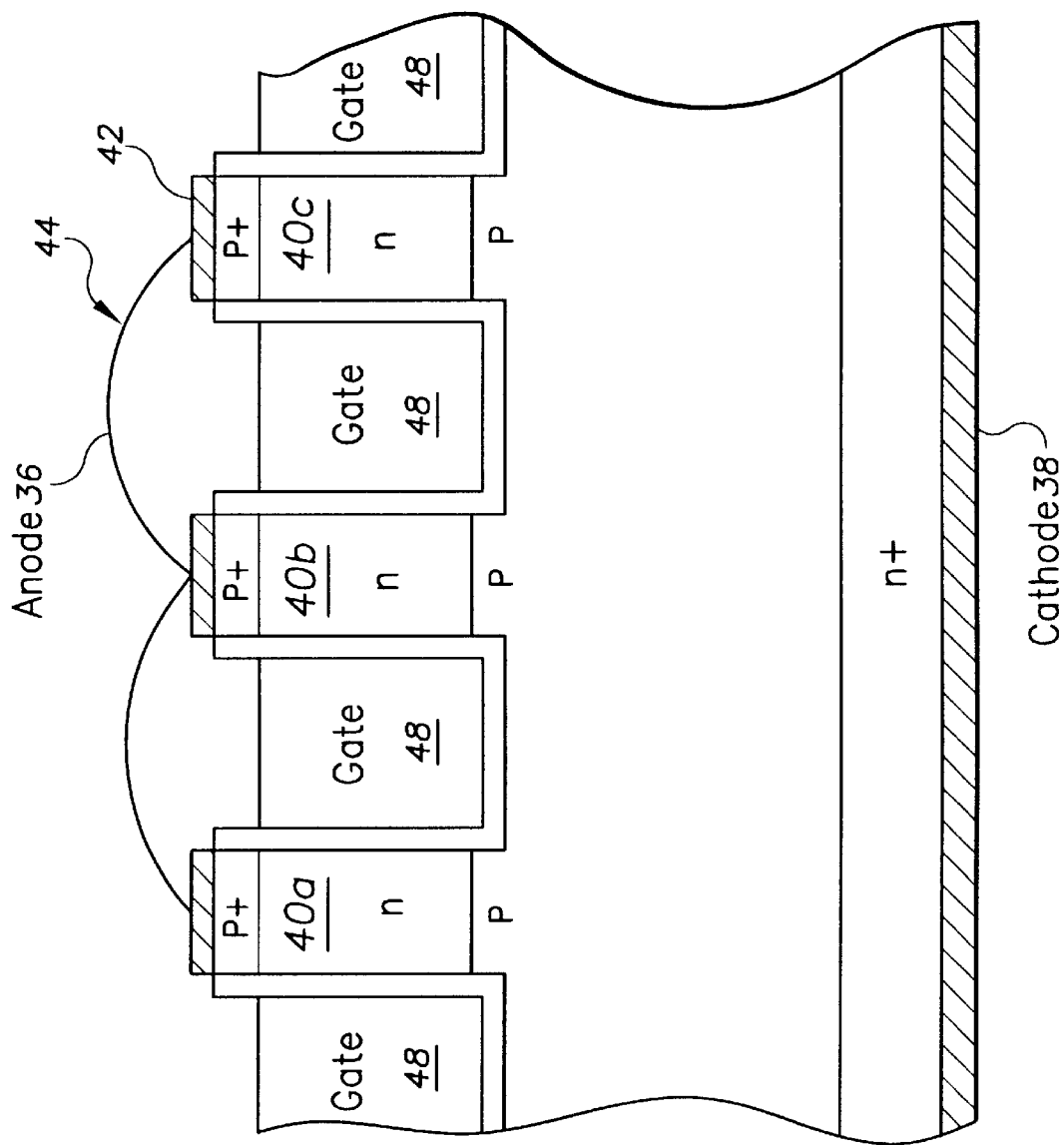
FIG. 8 is a power switch structure, according to another example embodiment of the present invention.

FIG. 8 is a power thryristor structure, according to another example embodiment of the present invention, having a common anode 36 and a common cathode 38 as its connecting terminals. The respective anodes of these devices are implemented using a metalization layer 42 interconnected by a conductor 44. The structure includes a plurality of PNPN-type NDR devices, three of which are depicted as 40a, 40b and 40c and each sandwiched between the common anode 36 and cathode 38. These NDR devices can be cells, stripes or different combinations of cells and/or stripes in the top view layout. Each of the plurality of PNPN-type NDR devices is constructed in a manner similar to the structure of FIG. 1, however, with respective control ports being provided by interconnected charge plates (or gates) 48 primarily adjacent to the upper N region of each PNPN-type NDR device. The power thyristor quickly changes between a current-passing mode and a current-blocking mode in response to an activation signal presented to the interconnected charge plates 48. This approach is advantageous since a quick state change is realized using a relatively low voltage. Moreover, this form of power thyristor can be readily expanded in terms of the number of NDR devices for high power applications or reduced in number for lower power applications.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes include, but are not necessarily limited to: altering the shapes, locations, and sizes of the illustrated gates; adding structures to the capacitively coupled NDR device; increasing the number of PN sections in the current-switching device; and interchanging P and N regions in the device structures and/or using PMOSFETS rather than NMOSFETS. Such modifications and changes do not depart from the true spirit and scope of the present invention that is set forth in the following claims.

What is claimed is:

1. A semiconductor device having a thyristor device with NDR characteristics, the device comprising:

at least two contiguous regions of the thyristor device, said at least two contiguous regions being of opposite polarity; and control means, located adjacent to and facing said at least one of the regions of the thyristor device, for capacitively coupling at least part of a voltage pulse to said at least one of the regions of the thyristor device, the thyristor device including the control means and said at least two contiguous regions, with said at least two contiguous regions, the control means for preponderantly controlling switching of the thyristor device from a current-passing mode to a current-blocking mode in response to the control means coupling at least one edge of a first voltage pulse to said at least one of the regions, and from a current-blocking mode to a current-passing mode in response to the control means coupling at least one edge of a second voltage pulse to said at least one of the regions, each of the first and second voltage pulses having a common polarity.

2. A semiconductor device, according to claim 1, further including at least one other thyristor device that also has at least two contiguous regions of opposite polarity and a control means, located adjacent to and facing at least one of the regions of the one other thyristor device, for capacitively coupling an edge of a voltage pulse to said at least one of the regions of the one other thyristor device.

3. A semiconductor device, according to claim 1, further including a layer of insulative material as part of a silicon-on-insulator structure, wherein the thyristor device is located adjacent the insulative material.

4. A semiconductor device, comprising:

memory means for providing a plurality of accessible and addressable memory cells, each of the memory cells having an NDR-type thyristor means including a multi-regioned body and control means for capacitively coupling at least part of a voltage pulse to at least part of the multi-regioned body; and with the multi-regioned body, the control means for switching of the thyristor means from a current-passing mode to a current-blocking mode in response to the control means coupling at least one edge of a first voltage pulse to said at least part of the multi-regioned body, and from a current-blocking mode to a current-passing mode in response to the control means coupling at least one edge of a second voltage pulse to said at least part of the multi-regioned body, each of the first and second voltage pulses having a common polarity.

5. A semiconductor device, according to claim 4, wherein each of memory cells includes a storage means for storing a data bit and includes a controllable access means for providing access to the storage means, and wherein the control means of the thyristor device is for enhancing writing access to the storage means.

6. A semiconductor device, comprising:

memory means for providing an accessible and addressable memory cell having an NDR-type thyristor means including a multi-regioned body and control means for capacitively coupling at least part of a voltage pulse to at least part of the multi-regioned body; and with the multi-regioned body, the control means for switching of the thyristor means from a current-passing mode to a current-blocking mode in response to the control means coupling at least one edge of a first voltage pulse to said at least part of the multi-regioned body, and from a current-blocking made to a current-passing mode in response to the control means coupling at least one edge of a second voltage pulse to said at least part of the multi-regioned body, each of the first and second voltage pulses having a common polarity.

7. A semiconductor device, according to claim 6, wherein the control means is responsive to a word line and the thyristor device provides two stable states for the memory cell.

8. A semiconductor device, according to claim 6, wherein at least two regions of the multi-regioned body are vertically arranged.

9. A semiconductor device, according to claim 6, wherein the control means and the multi-regioned body for providing switching of the thyristor device between a current-passing mode and a current-blocking mode independent of any insulated-gate field-effect transistor inversion channel formation against said at least one of the regions.

10. A semiconductor device, according to claim 9, wherein said memory means is an SRAM device.

11. A semiconductor device, according to claim 6, wherein said memory cell is an SRAM cell.

12. A semiconductor device, according to claim 11, wherein the SRAM cell includes a storage node, a bit line, a first word line, a second word line, an access circuit having means connected to the first word line for providing read and write access between the storage node and the bit line.

13. A semiconductor memory device, according to claim 6, further comprising means for maintaining the thyristor device in one of two stable states after the thyristor device switches between current-passing and current-blocking modes.

14. A semiconductor device having a thyristor device with NDR characteristics, the semiconductor device comprising:

at least two contiguous regions of the thyristor device, said at least two contiguous regions being of opposite polarity;

control means, located adjacent to and facing said at least one of the regions of the thyristor device, for capacitively coupling at least part of a voltage pulse to said at least one of the regions of the thyristor device, the thyristor device including the control means and said at least two contiguous regions, and with said at least two contiguous regions, the control means for switching the thyristor device from a current-passing mode to a current-blocking mode in response to the control means coupling at least part of a first voltage pulse to said at least one of the regions, and from a current-blocking mode to a current-passing mode in response to the control means coupling at least part of a second voltage pulse to said at least one of the regions, each of the first and second voltage pulses having a common polarity, the control means, the switching being independent of any insulated-gate field-effect transistor inversion channel formation against said at least one of the regions.

15. A semiconductor memory device, according to claim 14, wherein the control means and said at least two contiguous regions provide at least preponderant control for switching of the thyristor device between a current-passing mode and a current-blocking mode in response to the control means coupling at least part of a voltage pulse to said at least one of the regions.

* * * * *

UNITED STATES PATENT AND TRADEMARK OFFICE
CERTIFICATE OF CORRECTION

PATENT NO. : 6,727,529 B2
APPLICATION NO. : 10/103241
DATED : April 27, 2004
INVENTOR(S) : Nemati et al.

It is certified that error appears in the above-identified patent and that said Letters Patent is hereby corrected as shown below:

In the Specification

Col. 6, line 43: "0.3 um" should read --0.3 μm--.

Col. 6, line 64: "10 mÅ" should read --10mA--.

In the Claims

Col. 8, line 41, Claim 6: "made" should read --mode--.

Signed and Sealed this

Twenty-seventh Day of February, 2007

JON W. DUDAS
*Director of the United States Patent and Trademark Office*